United States Patent
Luo

(10) Patent No.: US 10,247,766 B2
(45) Date of Patent: Apr. 2, 2019

(54) SYSTEM, METHOD AND TEST LAYOUT FOR DETECTING LEAKAGE CURRENT

(71) Applicant: SHANGHAI HUALI MICROELECTRONICS CORPORATION, Shanghai (CN)

(72) Inventor: Fei Luo, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 230 days.

(21) Appl. No.: 15/260,361

(22) Filed: Sep. 9, 2016

(65) Prior Publication Data

US 2017/0082673 A1    Mar. 23, 2017

(30) Foreign Application Priority Data

Sep. 17, 2015 (CN) .......................... 2015 1 0592962

(51) Int. Cl.
   *G01R 31/02*   (2006.01)
   *G01R 31/26*   (2014.01)
   *H01L 21/66*   (2006.01)
   *G01R 31/30*   (2006.01)

(52) U.S. Cl.
   CPC ....... *G01R 31/025* (2013.01); *G01R 31/3008* (2013.01); *H01L 22/14* (2013.01); *G01R 31/26* (2013.01)

(58) Field of Classification Search
   None
   See application file for complete search history.

(56) References Cited

U.S. PATENT DOCUMENTS

2009/0014718 A1*  1/2009 Hong ...................... H01L 22/14
                                              257/48

* cited by examiner

*Primary Examiner* — Jermele M Hollington
(74) *Attorney, Agent, or Firm* — Tianchen LLC

(57) ABSTRACT

A test layout, a system, and a method for detecting leakage current are disclosed. The test layout module includes M PN junction diode leakage current test units formed in the FEOL process, parallel-connect with a classical leakage current test unit formed in the metal layer; wherein, P-regions of the PN junction diodes are connected to a high potential, N-regions of the PN junction diodes are connected to a low potential, the junction areas of the PN junction diodes are different each other, each of the PN junction diode leakage current test units is controlled by one switch respectively, the positive integer M is greater than or equal to 1. Through paralleling the PN junction diodes formed in the FEOL process with the classical leakage current test unit in the metal layer, not only the required test layout area utilized to detect the leakage current in the metal layer is reduced, but also the detecting accuracy is further enhanced.

4 Claims, 1 Drawing Sheet

SYSTEM, METHOD AND TEST LAYOUT FOR DETECTING LEAKAGE CURRENT

CROSS-REFERENCE TO RELATED APPLICATION

This application claims the priority benefit of China patent application serial No. 201510592962.5, filed Sep. 17, 2015. The entire contents of the above-mentioned patent application are hereby incorporated by reference herein and made a part of the specifications.

FIELD OF THE INVENTION

The present invention relates to the field of semiconductor IC manufacturing technology, particularly to a CMOS device and a CMOS process, and further in detail to a test layout, a system and a method for detecting leakage current in a metal layer.

BACKGROUND OF THE INVENTION

With the continuous development of semiconductor manufacturing technology, the pattern critical dimension of the integrated circuit chips is becoming smaller and smaller, therefore, the requirement for the detecting method is becoming higher and higher. For example, after forming a metal layer at the CMOS BEOL process, a leakage current test would be needed to adjacent patterns or lines in the metal layer, in order to avoid the occurrence of the short circuit between the adjacent patterns or the lines.

Referring now to FIG. 1, which is a schematic view illustrating a test layout for leakage current in a metal layer and a cross section of the test layout in the prior art. As shown in the FIG. 1, because the leakage current in the metal layer is very slim in nature, the current of a single detecting element (the minimum square in the test layout) is so small that beyond the minimum precision of a test device. Therefore, a plurality of the single detecting elements are paralleled to increase the total current, then the leakage current of the single detecting element is received by a calculation.

Shown in the FIG. 1, a detecting element of the test layout is fragmentary enlarged. It is found that the detecting element employed by the prior art is usually formed by two-group separate comb structures staggered, of which one group is connected to the high potential, and another group is connected to the low potential. In addition, the cross-sectional schematic view of the test layout shown on the right of the FIG. 1 has shown that two-group patterns in the first metal layer are arrayed in turn. Therefore, once the short circuit occurs between any two adjacent metal lines, a big leakage current would the detected.

In the actual process, the test layouts, which are utilized to monitor the occurrence of the short circuit during the process, are usually arranged in the empty space between chips on the substrate. With the continuous decreasing of the chip size, more detecting elements of the test layout shown in the FIG. 1 are required to measure effectively the leakage current. It is well known that the more the detecting elements are, the more the empty space is needed. However, on the contrary, the development of the IC technology requires the decreasing of the empty space on the substrate to make more room for more chips, so that increasing the number of chips output.

Therefore, how to get the results with high accuracy on the condition of the decreasing area of the test layout for detecting leakage current becomes an urgent problem at present in the field of semiconductor IC manufacturing technology.

BRIEF SUMMARY OF THE DISCLOSURE

To overcome the problems as mentioned above, it is an object of the present invention to provide a new test layout, a new system and a new method for detecting leakage current. The new detecting method has overcome the oversize problem of the test layout by paralleling the PN junction diodes formed in the FEOL process with the classical leakage current test units in the metal layer. At the same time, due to the stability of the PN junction diodes leakage current, the detecting accuracy for the leakage current in the metal layer can be greatly enhanced.

To achieve above object, technical solutions of the present invention are as follows:

A system for detecting leakage current in a metal layer, comprising:

a test layout module, a detecting module, and a calculating module; the test layout module includes M PN junction diode leakage current test units formed in the FEOL process parallel-connect with a classical leakage current test unit formed in the metal layer; wherein, P-regions of the PN junction diodes are connected to a high potential, N-regions of the PN junction diodes are connected to a low potential, the junction areas of the PN junction diodes are different each other, each of the PN junction diode leakage current test units is controlled by one switch respectively, the positive integer M is greater than or equal to 1; and the detecting module, utilized to detect the leakage values of the test layout module, the leakage values of each PN junction diode respectively, and the leakage values of each PN junction diode paralleled with the classical leakage current test units in the metal layer respectively;

the calculating module, utilized to calculate final leakage value in the metal layer according to the leakage values of the test layout module, the leakage values of each PN junction diode respectively, the leakage values of each PN junction diodes paralleled with the classical leakage current test units in the metal layer respectively, and the relations between them.

Preferably, the positive integer M is equal to 2. The two PN junction diodes are formed in the layer under the metal layer having the classical leakage current test unit. The formation steps of the two PN junction diodes with different junction areas are as follows:

firstly, forming a N-well by implanting ions in the substrate;

secondly, forming two different P-wells and two P-type contact points with high concentration respectively by the implanting ions in the N-well;

thirdly, forming a N-type contact point with high concentration between the two different P-wells by the ions implantation;

finally, connecting the contact points with high concentration to metal lines of the classical leakage current test unit in the metal layer by through holes, and completing a parallel connection between the PN junction diodes and the classical leakage current test unit in the metal layer; wherein, the P-type connect points with high concentration are connected to the high potential of the metal layer, and the N-type connect points with high concentration are connected to the low potential of the metal layer.

To achieve above object, technical solutions of the present invention are also as follows:

A test layout module for detecting leakage current in a metal layer, which is utilized to detect the final leakage value in the metal layer, comprising:

M PN junction diode leakage current test units formed in the FEOL process parallel-connect with a classical leakage test unit formed in the metal layer; wherein, P-regions of the PN junction diodes are connected to a high potential, N-regions of the PN junction diodes are connected to a low potential, the junction areas of the PN junction diodes are different each other, each of the PN junction diode leakage current test units is controlled by one switch respectively, the positive integer M is greater than or equal to 1.

To achieve above object, technical solutions of the present invention are also as follows:

A detecting method used to detect leakage current in a metal layer, comprising the steps of:

when the positive integer M is equal to 1, comprising the steps of:

Step S11: detecting the leakage value of the PN junction diode;

Step S12: detecting the leakage value of the PN junction diode paralleled with the classical leakage current test unit in the metal layer, in other words, detecting the leakage value of the test layout module;

Step S13: calculating final leakage value in the metal layer by subtracting the leakage value of the PN junction diode from the leakage value of the test layout module; or when the positive integer M is greater than or equal to 2, comprising the steps of:

Step S21: detecting the leakage values of each of the M PN junction diodes respectively;

Step S22: detecting the leakage values of each PN junction diode paralleled with the classical leakage current test unit in the metal layer respectively, and calculating M first leakage values in the metal layer by respectively subtracting one of the leakage value of the PN junction diodes detected in the Step S21 from the corresponding leakage values of the PN junction diode paralleled with the classical leakage current test unit in the metal layer detected in the Step S22;

Step S23: detecting the leakage value of the test layout module;

Step S24: calculating second leakage value in the metal layer by subtracting in turn the leakage values of the M PN junction diodes detected in the Step S21 from the leakage value of the test layout module detected in the Step S23;

Step S25: calculating final leakage value in the metal layer by taking the average of the M first leakage values in the metal layer detected in the Step S22 and the second leakage value in the metal layer detected in the Step S24.

Concluded from the above technical solutions, due to the leakage current of the PN junction diodes is about ten times to that of the metal layer, majority of the total leakage current, and the formation step of the PN junction diodes is only decided by the strictly controlled processes, e.g., the ions implantation and the thermal annealing, the detecting results of the PN junction diodes leakage current are very stable and hardly impacted by the detecting conditions. Therefore, the detected leakage values are accurate and believable, further, the error of the final leakage value in the metal layer will be very small.

In summary, the present invention carries on a leakage current detecting by paralleling the PN junction diodes formed in the FEOL process with the classical leakage current test unit in the metal layer, not only has reduced the area of the test layout required by the leakage current detecting in the metal layer, but also has increased the detecting accuracy.

DETAILED DESCRIPTION OF THE EMBODIMENTS

The present invention will be described in further details hereinafter by referring to the accompanying drawings, so as to provide a better understanding of the present invention.

It should be noted that, with the prior art is the same, the present invention provides a technical solution requiring a plurality of detecting structures in parallel to increase the total amount of leakage current, finally, the leakage current amount of the single test unit would be obtained by calculating. However, unlike the prior art is that, the each of detecting structures in parallel comprises one or more PN junction diodes forming in the FEOL process. The plurality of detecting structures including the PN junction diodes formed in the FEOL process and the classical leakage test unit formed in the metal layer in parallel are used, not only can reduce the test layout area for detecting leakage current in the metal layer, but also can further improve the detecting accuracy of the leakage current.

A system for detecting leakage current in a metal layer, comprising: a test layout module, a detecting module, and a calculating module; the test layout module includes M PN junction diode leakage current test units formed in the FEOL process parallel-connect with a classical leakage current test unit formed in the metal layer. Wherein, P-regions of the PN junction diodes are connected to a high potential, N-regions of the PN junction diodes are connected to a low potential. The junction areas of the PN junction diodes are different each other, each of the PN junction diode leakage current test units is controlled by one switch respectively, the positive integer M is greater than or equal to 1. The detecting module is utilized to detect the leakage values of the test layout module, the leakage values of each PN junction diode respectively, and the leakage values of each PN junction diode paralleled with the classical leakage current test units in the metal layer respectively. The calculating module is utilized to calculate final leakage value in the metal layer according to the leakage values of the test layout module, the leakage values of each PN junction diode respectively, the leakage values of each PN junction diodes paralleled with the classical leakage current test units in the metal layer respectively, and the relations between them.

Now, a preferred embodiment will be disclosed to describe the present invention, wherein, the positive integer M is equal to 2.

Figure 1:
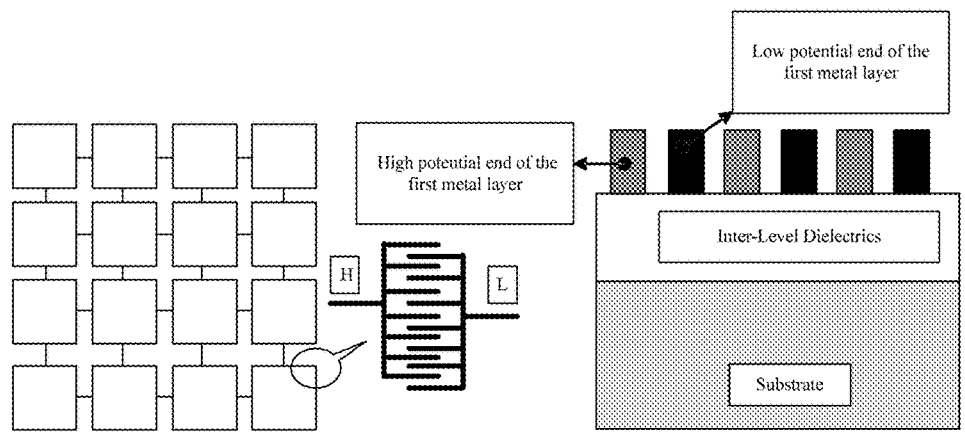
FIG. 1 is a schematic view illustrating a test layout for detecting leakage current in a metal layer and a cross section of a detecting element according to the prior art.
Figure 2:
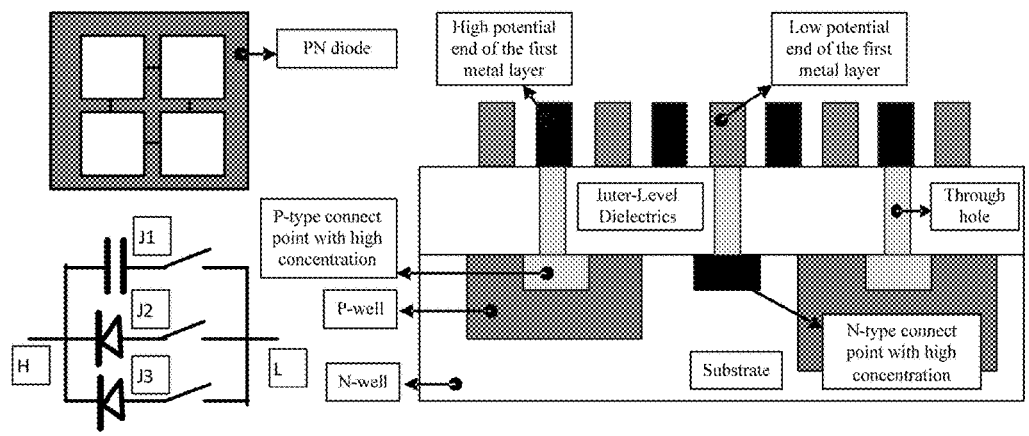
FIG. 2 is a schematic view illustrating a test layout for detecting leakage current in a metal layer, a circuit diagram and a cross section of a detecting element according to the present invention.

Specially, referring to FIG. 2, which is a schematic view illustrating a test layout for detecting leakage current in a metal layer, a circuit diagram and a cross section of a detecting element according to the present invention. As shown on the upper left corner of the FIG. 2, the simplified view of the test layout indicates that the PN junction diodes are added in the layer under the metal layer having the classical leakage current test unit, and both the number of the detecting elements and the area of the test layout are greatly reduced. And, the PN junction diode leakage current test units formed in the FEOL process paralleled with the classical leakage current test unit formed in the metal layer is utilized to detect the leakage current according to the present invention, the leakage current of the PN junction diodes is about ten times to that of the metal layer.

Referring to FIG. 2, again, the simplified view of the circuit diagram shown on the lower left corner of the FIG. 2 indicates that the classical leakage current test units is respectively paralleled by two different PN junction diodes to proceed a leakage current detecting. The right view of the FIG. 2 illustrating the cross section of a detecting element of the present invention indicates that the PN junction diodes are added in the layer under the metal layer having the classical leakage current test unit.

The two PN junction diodes are formed in the layer under the metal layer having the classical leakage current test unit. The formation steps of the two PN junction diodes with different junction areas are as follows:

firstly, forming a N-well by implanting ions in the substrate;

secondly, forming two different P-wells and two P-type contact points with high concentration respectively by the implanting ions in the N-well;

thirdly, forming a N-type contact point with high concentration between the two different P-wells by the ions implantation;

finally, connecting the contact points with high concentration to metal lines of the classical leakage current test unit in the metal layer by through holes, and completing a parallel connection between the PN junction diodes and the classical leakage current test unit in the metal layer; wherein, the P-type connect points with high concentration are connected to the high potential of the metal layer, and the N-type connect points with high concentration are connected to the low potential of the metal layer.

Since the PN junction diodes are formed by the ions implantation, increasing the depth of the ions implantation can be utilized to increase the junction area of the PN junction diodes on the condition of remaining the test layout area unchanged, so as to receive the different leakage current on the same test layout area.

During the process of detecting the leakage current in the metal layer, one or more PN junction diode leakage current test units formed in the FEOL process can be chosen to parallel with one or more classical leakage current test units formed in the metal layer in a test layout module. In other words, the paralleled relations between the classical leakage current test units and the PN junction diodes can be various. Several PN junction diodes can be paralleled to a single classical leakage current test unit to proceed a leakage current detecting, so as to enhance the detecting accuracy.

It may be detailed description in the following embodiments. A test layout module (embodiment 1) comprising a PN junction diode formed in the FEOL process and a classical leakage current test unit, and another test layout module (embodiment 2) comprising several PN junction diodes formed in the FEOL process and a classical leakage current test unit, are respectively taken as examples to describe the present invention in further detail.

The Embodiment 1

When the test layout module comprises a PN junction diode formed in the FEOL process and a classical leakage current test unit formed in the metal layer, a detecting method used to detect leakage current in a metal layer, comprising the steps of:

Step S11: detecting the leakage value of the PN junction diode;

Step S12: detecting the leakage value of the PN junction diode paralleled with the classical leakage current test unit in the metal layer, in other words, detecting the leakage value of the test layout module;

Step S13: calculating final leakage value in the metal layer by subtracting the leakage value of the PN junction diode from the leakage value of the test layout module.

The Embodiment 2

When the test layout module comprises M (the positive integer M is greater than or equal to 2) PN junction diodes formed in the FEOL process and a classical leakage current test unit formed in the metal layer, a detecting method used to detect leakage current in a metal layer, comprising the steps of:

Step S21: detecting the leakage values of each of the M PN junction diodes respectively;

Step S22: detecting the leakage values of each PN junction diode paralleled with the classical leakage current test unit in the metal layer respectively, and calculating M first leakage values in the metal layer by respectively subtracting one of the leakage value of the PN junction diodes detected in the Step S21 from the corresponding leakage values of the PN junction diode paralleled with the classical leakage current test unit in the metal layer detected in the Step S22;

Step S23: detecting the leakage value of the test layout module;

Step S24: calculating second leakage value in the metal layer by subtracting in turn the leakage values of the M PN junction diodes detected in the Step S21 from the leakage value of the test layout module detected in the Step S23;

Step S5: calculating final leakage value in the metal layer by taking the average of the M first leakage values in the metal layer detected in the Step S22 and the second leakage value in the metal layer detected in the Step S24.

Referring to Table 1 in conjunction with FIG. 2, which discloses a detecting method used to detect the leakage current in the metal layer using a detecting structure paralleled by two PN junction diodes and a classical leakage current test unit.

Specially, during the detecting process for leakage current, firstly, to proceed a parallel detecting for different combinations of the three kinds structures by applying a voltage between the high potential and the low potential. Secondly, detecting the leakage values of two different PN junction diodes separately. Finally, calculating final leakage value in the metal layer.

TABLE 1

| Steps | Detecting method | The leakage current | The leakage value in the metal |
|---|---|---|---|
| Step S21 | Detecting the leakage value of the PN junction diode J2 | J2 | Null |
| Step S22 | Detecting the leakage value of the PN junction diode J3 | J3 | Null |
| Step S23 | Detecting the leakage value of a parallel circuit by J1 and J2 | A | A-J2 |
| Step S24 | Detecting the leakage value of a parallel circuit by J1 and J3 | B | B-J3 |

TABLE 1-continued

| Steps | Detecting method | The leakage current | The leakage value in the metal | |
|---|---|---|---|---|
| Step S25 | Detecting the leakage value of a parallel circuit by J1, J2 and J3 | C | C-J2-J3 | 5 |
| | The final leakage value in the metal layer | | The average of the results of the Step S3, the Step S4 and the Step S5 | 10 |

During the detecting process for leakage current, due to the leakage value of the PN junction diode is about ten times to that of the metal layer, majority of the total leakage current, and the formation step of the PN junction diodes is only decided by the strictly controlled processes, e.g., the ions implantation and the thermal annealing, the detecting results of the PN junction diodes leakage current are very stable and hardly impacted by the detecting conditions.

In order to demonstrate the advantages of the present invention more clearly, the key indicators, e.g., the test layout area and the detecting accuracy, are compared to the prior art by performing an experiment. Referring to Table 2, which shows the comparing results of the test layout area and the detecting accuracy required by the detecting structure between the present invention and the prior art.

TABLE 2

| | Solutions | Test layout area | Detecting accuracy |
|---|---|---|---|
| 1 | Prior art | 300 um × 2000 um = 600000 um$^2$ | $1.0 \times 10^{-11}$ A |
| 2 | Present invention Results | 300 um × 300 um = 90000 um$^2$ | $2.0 \times 10^{-12}$ A |
| | | The test layout area of the present invention is reduced by 85%. | The detecting accuracy of the present invention is increased to five times. |

Therefore, through reasonably using the existing substrate under the classical leakage current test unit to form the PN junction diodes, and paralleling it with the classical leakage current test unit in the metal layer, the test layout area is reduced by 85%, and the detecting accuracy is increased to five times.

In summary, by paralleling the PN junction diodes formed in the FEOL process with the classical leakage current test unit in the metal layer for a leakage current detecting in the present invention, the test layout area required by the leakage current detecting in the metal layer not only has reduced, the detecting accuracy of the leakage current but also has increased. In other words, the detected leakage values are accurate and believable, further, the error of the final leakage value in the metal layer will be very small.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A system for detecting leakage current in a metal layer, comprising:
a test layout module, a detecting module and a calculating module; the test layout module includes M PN junction diode leakage current test units and a classical leakage current test unit, wherein the M PN junction diode leakage current test units are formed in FEOL processes, the classical leakage current test unit is formed in the metal layer; the M PN junction diode leakage current test units are parallel-connected with the classical leakage current test unit; wherein, the classical leakage current test unit is formed by two-group metal lines, of which one group is connected to a high potential and the other group is connected to a low potential; wherein each PN junction diode leakage current test unit comprises a P-type contact point with high concentration which is connected to the high potential and an N-type contact point with high concentration which is connected to the low potential, junction areas of the PN junction diode leakage current test units are different in size from each other, each of the PN junction diode leakage current test units is controlled by one switch respectively, M is a positive integer greater than or equal to 1;
the detecting module, utilized to detect leakage values of the test layout module, leakage values of each PN junction diode leakage current test unit respectively, and leakage values of each PN junction diode leakage current test units paralleled with the classical leakage current test units in the metal layer respectively; and
the calculating module, utilized to calculate final leakage value in the metal layer according to the leakage values of the test layout module, the leakage values of each PN junction diode leakage current test units respectively, the leakage values of each PN junction diode leakage current test units paralleled with the classical leakage current test units in the metal layer respectively, and the relations between them.

2. The system according to claim 1, wherein the positive integer M is equal to 2.

3. The system according to claim 2, wherein two PN junction diode leakage current test units are formed in a layer below the metal layer having the classical leakage current test unit.

4. The system according to claim 3, wherein the two PN junction diode leakage current test units with different junction areas are formed as follows:
firstly, forming a N-well by implanting ions in a substrate;
secondly, forming two different P-wells and two P-type contact points with high concentration respectively by implanting ions in the N-well;
thirdly, forming a N-type contact point with high concentration between the two different P-wells by ion implantation;
finally, connecting the contact points with high concentration to metal lines of the classical leakage current test unit in the metal layer by through holes, and completing a parallel connection between the PN junction diode leakage current test units and the classical leakage current test unit in the metal layer; wherein, the P-type connect points with high concentration are connected to the high potential of the metal layer, and the N-type connect points with high concentration are connected to the low potential of the metal layer.

* * * * *